United States Patent
Kennedy et al.

(10) Patent No.: US 7,627,850 B2
(45) Date of Patent: Dec. 1, 2009

(54) SYSTEM, METHOD, AND SOFTWARE FOR RELATION-BASED PRODUCT DEVELOPMENT

(75) Inventors: Brian M. Kennedy, Coppell, TX (US); Michael N. Kennedy, Anna, TX (US)

(73) Assignee: Targeted Convergence Corporation, Coppell, TX (US)

( * ) Notice: Subject to any disclaimer, the term of this patent is extended or adjusted under 35 U.S.C. 154(b) by 737 days.

(21) Appl. No.: 10/970,745

(22) Filed: Oct. 20, 2004

(65) Prior Publication Data

US 2006/0101378 A1     May 11, 2006

(51) Int. Cl.
*G06F 9/44*     (2006.01)
(52) U.S. Cl. ...................................... 717/105
(58) Field of Classification Search ....................... None
See application file for complete search history.

(56) References Cited

U.S. PATENT DOCUMENTS

| | | | |
|---|---|---|---|
| 6,115,691 A | 9/2000 | Ulwick | |
| 6,912,502 B1 | 6/2005 | Buddle et al. | |
| 6,931,366 B2 | 8/2005 | Wang et al. | |
| 7,213,232 B1* | 5/2007 | Knowles | 717/121 |
| 2003/0149944 A1 | 8/2003 | Reasoner | |
| 2003/0216955 A1 | 11/2003 | Miller et al. | |
| 2006/0020629 A1* | 1/2006 | Ramani et al. | 707/104.1 |
| 2006/0064299 A1 | 5/2006 | Kennedy et al. | |
| 2006/0100916 A1 | 5/2006 | Kennedy et al. | |
| 2006/0253479 A1 | 11/2006 | Kennedy et al. | |

FOREIGN PATENT DOCUMENTS

GB     2 320 969 A     7/1998

OTHER PUBLICATIONS

Goffin, Keith, Evaluating Customer Support During New Product Development—An Explorative Study, Journal of Product Innovation Management, Oct. 2003, vol. 15 Issue 1, pp. 42-56. [retrieved on May 21, 2009] Retrieved from the Internet:<URL:http://www3.interscience.wiley.com/journal/119124975/abstract?CRETRY=1&SRETRY=0.*

(Continued)

*Primary Examiner*—Tuan Q Dam
*Assistant Examiner*—Cheneca P Smith
(74) *Attorney, Agent, or Firm*—Baker Botts L.L.P.

(57) ABSTRACT

A product design method includes accessing a defined product design structure. The product design structure includes a number of customer concerns, a number of physical properties associated with components of the product, and a number of relation models. Each customer concern is associated with at least one physical property via at least one mathematical relationship defined in at least one of the relation models. The method also includes receiving a value associated with one or more of the physical properties and calculating (using one or more of the relation models) the effect of the received value associated with the one or more physical properties on one or more of the customer concerns. Furthermore, the method includes displaying the calculated effect on the one or more customer concerns and receiving one or more adjustments of the value associated with one or more of the physical properties to create a desired effect on one or more of the customer concerns.

34 Claims, 5 Drawing Sheets

OTHER PUBLICATIONS

Holtzblatt, K., Beyer, H., Making customer-centered design work for teams, Communications of the ACM, vol. 35 Issue 10, Oct. 1993, pp. 92-103 [retrieved on May 21, 2009] Retrieved from the Internet<URL:http://portal.acm.org/citation.cfm?doid=163430.164050.*

Walter, Achim, Relationship-specific Factors Influencing Supplier Involvement in Customer New Product Development, [retrieved on May 21, 2009] Retrieved from the Internet<URL:http://www.sciencedirect.com/science?_ob=ArticleURL&_udi=B6V7S-48V956G-7&_user=2502287&_rdoc=1&_fmt=&_orig=search&_sort=d&view=c&_acct=C000055109&_version=1&.*

Communication from the European Patent Office, European Search Report for Application No. PCT/US2005/40904 mailed Nov. 13, 2006, 8 pages.

Communication from the European Patent Office, European Search Report for Application No. PCT/US2005/037050 and Written Opinion of the International Search Authority, mailed Nov. 3, 2006, 14 pages.

Vora et al., "TIES: An Engineering Design Methodology and System," Proceedings of the Second Conference on Innovative Applications of Artificial Intelligence, 1990, pp. 131-144.

Srinivasan et al., "Design Shell—A Framework for Interactive Parametric Design," ASME Des. Eng. Div. Publ. De, American Society of Mechanical Engineers Division, DE: Advances in Design Automation, vol. 23, No. part 1, 1990, pp. 289-295.

Myung et al., "Knowledge-Based Parametric Design of Mechanical Products Based on Configuration Design Method," Expert Systems with Applications, 2001, pp. 99-107.

Vora et al., "Technical Information Engineering System (TIES)," SME Tech Pap Ser. Ms; SME Technical Paper (Series) MS 1989, Publ By SME, Dearborn, Michigan, USA, 1989, 9 pages.

* cited by examiner

SYSTEM, METHOD, AND SOFTWARE FOR RELATION-BASED PRODUCT DEVELOPMENT

TECHNICAL FIELD

The present invention relates generally to product development techniques and, more particularly, to a system, method, and software for relation-based product development.

BACKGROUND OF THE INVENTION

The vast majority of product development efforts share the same basic operational characteristics and yield similar levels of productivity. The first dominant characteristic is the way products are broken down into subassemblies. The assembly-level engineers define the subassemblies that will form the product/assembly. For each subassembly, the engineers create a set of design and build specifications that will allow that subassembly to work with the other subassemblies in such a way that they together will satisfy the specifications for the assembly as a whole. The subassembly engineers will then design their subassembly to conform to those specifications as best as possible. In doing so, the engineers may, in turn, define and specify further subassemblies (sub-subassemblies, etc.). In this way, a full hierarchy of subassemblies is defined in such a way that each development team can focus only upon satisfying their subassembly's specifications.

The typical result of such a development process is that the completed subassemblies often do not fully meet the expectations for that subassembly. This may be caused by many things. The assembly engineers may have failed to embody all of their expectations in the subassembly specifications, the subassembly specifications may be interpreted differently by the subassembly engineers than by the assembly engineers, or the subassembly engineers may simply have not been able to develop a subassembly that would meet those specifications (for example, the specifications may have been unachievable or the engineers may have underperformed).

Given that typical result, the development process typically includes an integration testing step where the prototype subassemblies are assembled together and tested. This integration testing may be done in software via simulation, solid modeling, and other design tools, or it may be done using physical, working models of the subassemblies. If the integration tests fail, as is often the case, then one or all subassembly development teams have to rework their designs to achieve revised or refined specifications. Such looping can be very expensive to the overall development process and can make the process timing rather unpredictable. When faced with assemblies that have several levels of hierarchy, the schedule delays become compounded and the costs can skyrocket. Further, engineers end up spending massive amounts of time waiting due to other subassembly delays or re-working due to faulty specifications, which reduces overall productivity dramatically.

The second dominant characteristic of typical product development efforts is the way that knowledge learned in one project is leveraged in future projects. In the vast majority of businesses, such knowledge is captured only in the heads of the engineers that did the work. It is rarely put into a form that is even visible to other engineers; and in rare cases where it is documented, it is typically in a form that is not readily usable by other engineers.

Further, learning is typically treated as a nice by-product of the development process, but is not embraced as a fundamental goal of the development process. Engineers rarely take extra time on a project in order to simply increase the knowledge learned. Given how inefficiently the knowledge is captured and reused, such efforts would be considered wasteful. Thus, a tremendous amount of learning opportunities are simply bypassed in favor of focusing on completing the project.

Unfortunately, such failure to learn and such failure to make the learned knowledge usable results in a lack of flexibility and adaptability when problems occur (such as the integration test failures mentioned previously). This often results in re-learning what has already been mostly learned, but not completely learned (or at least not in a way that makes the knowledge usable in the iteration).

The third dominant characteristic of typical product development efforts, which is a natural result of the first two characteristics, is the severe limitations on innovation during product development processes. Despite the fact that most development efforts would like to encourage innovation, and despite the fact that many of these efforts require innovation in order to satisfy the goals, the vast majority of development efforts severely limit the amount of innovation that is possible.

First, the specification-based development process creates severe limitations on innovation, not allowing anything that would violate the specifications, while at the same time often requiring excessive innovation, in order to satisfy unachievable or near-unachievable specifications. Worse, the specification process puts the majority of the innovation opportunity in the hands of the assembly designer rather than the subassembly designer, who is typically the greater expert on that particular subassembly.

When you couple that with a process that does not encourage learning and does not make the knowledge that is learned readily available, many opportunities for innovation will not be available simply due to a lack of usable knowledge. In fact, the term "fuzzy front end" has become a standard phrase in reference to this situation—early innovation and decision-making is based upon wishful thinking, lack of robust technical knowledge, and the intuition of a few engineers who cannot concretely explain their decisions. As a result, the vast majority of product development efforts deliver disappointing improvements over prior products. That can dramatically reduce the competitiveness of the products.

SUMMARY OF THE INVENTION

The present invention provides a system and method for relation-based product development that substantially eliminates or reduces at least some of the disadvantages and problems associated with previous systems and methods.

In accordance with a particular embodiment of the present invention, a product design method includes accessing a defined product design structure. The product design structure includes a number of customer concerns, a number of physical properties associated with components of the product, and a number of relation models. Each customer concern is associated with at least one physical property via at least one mathematical relationship defined in at least one of the relation models. The method also includes receiving a value associated with one or more of the physical properties and calculating (using one or more of the relation models) the effect of the received value associated with the one or more physical properties on one or more of the customer concerns. Furthermore, the method includes displaying the calculated effect on the one or more customer concerns and receiving one or more adjustments of the value associated with one or more of the physical properties to create a desired effect on one or more of the customer concerns.

Technical advantages of particular embodiments of the present invention include a system and method for targeted, relation-based product development that facilitates the ongoing capture of product knowledge for businesses that involve the continued design, development, productization, and introduction of new or improved products. For example, particular embodiments provide for the definition and analysis of product designs in terms of mathematical relations between customer or user concerns and the fundamental product characteristics (physical properties), wherein targets and allowed ranges can be defined for each relation and mathematically propagated to the other related relations. Such a system allows design engineers to visualize the design possibilities, based on acquired knowledge, that are consistent with the many design targets that they are trying to juggle.

In particular embodiments, the empirical data used to construct the mathematical relations can be recorded and preserved over time in such a way that knowledge learned by a business is effectively captured in a form that can be easily reused in design efforts, even by engineers who had no involvement in the acquisition of that knowledge. Such a system that breaks down design knowledge into component mathematical relations and limits that have been tested allows that knowledge to be captured and preserved over time in a format that can be readily searched, analyzed, and understood during later design projects.

In addition, in certain embodiments, profitability criteria can also be defined along with the mathematical relations, such that a mathematical optimization can be performed to recommend and visually illustrate the design possibilities that will be most profitable, taking into account the inherent trade-offs between various design choices. Such a system allows design engineers to quickly discover optimal design choices among a myriad of competing trade-offs, in such a way that the engineer can easily vary the profitability model and see the effects on the design decisions.

In particular embodiments, the mathematical relations can also be assigned a confidence value by those who are expert in that relation, and those confidence values can be propagated mathematically to dependent relations, such that design engineers can easily visualize where their design decisions may be compromised, and where further research to raise confidence levels may be required. Such a system allows the best available knowledge to be captured without concern about undermining development decisions based on questionable knowledge.

Furthermore, certain embodiments may enable the definition, analysis, partitioning, and management of product designs in terms of component subassemblies that are related to the larger assembly by mathematical relations between customer or user concerns on the larger assembly and subassembly concerns on the subassembly, wherein those subassembly concerns are related to the fundamental subassembly characteristics via mathematical relations. Such a system allows design engineers responsible for different portions of an overall product design to work cooperatively and efficiently, as the shared knowledge can be better leveraged in mathematical form, and further decisions that narrow possibilities can be immediately communicated to and analyzed by all whose designs are affected.

In particular embodiments, the mathematical relations may be specified imprecisely, reflecting only the general shape of the relation (for example, increasing linearly), but not the precise numerical values. Such imprecise specifications allow engineers to express learned "rules of thumb" or other rough relationships and allow the system to perform rough-cut analyses and propagations to provide a level of insight to the engineers prior to the testing, experimentation, or analyses needed to specify the relations more precisely.

Further, certain embodiments may enable sophisticated search tools that allow an engineer to express desired values for attributes (whether customer concerns, physical properties, or intermediate attributes), and find any relations (through time) that support those values.

Other technical advantages may be readily apparent to one skilled in the art from the following figures, descriptions and claims. Moreover, while specific advantages have been enumerated above, various embodiments may include all, some or none of the enumerated advantages.

BRIEF DESCRIPTION OF THE DRAWINGS

For a more complete understanding of particular embodiments of the invention and their advantages, reference is now made to the following descriptions, taken in conjunction with the accompanying drawings, in which.

DETAILED DESCRIPTION

As described above, typical product development techniques result in design decisions that limit that potential innovation, resulting in inferior product designs, and also typically requiring reworking of these inferior product designs, resulting in the product development being completed behind schedule. Productivity in product development is further limited by the great difficulty that design teams and businesses have in capturing the knowledge learned during previous product development projects in a form that can be used effectively on later projects. The knowledge that needs to be captured is not simply the prior design—it is the underlying knowledge that properly drove the design decisions embodied in those prior designs. A finished design specification, drawing, or solid model simply does not provide an understanding of this knowledge that drove the design decisions.

However, if a system that allows capture of and visibility to such product development knowledge is provided, it then becomes worthwhile to invest development time focused on generating usable knowledge that can then accelerate multiple following development projects, paying significant dividends not only in productivity, but also in flexibility in dealing with problems and innovation in achieving superior products. Embodiments of the present invention provide such a system.

Figure 1:
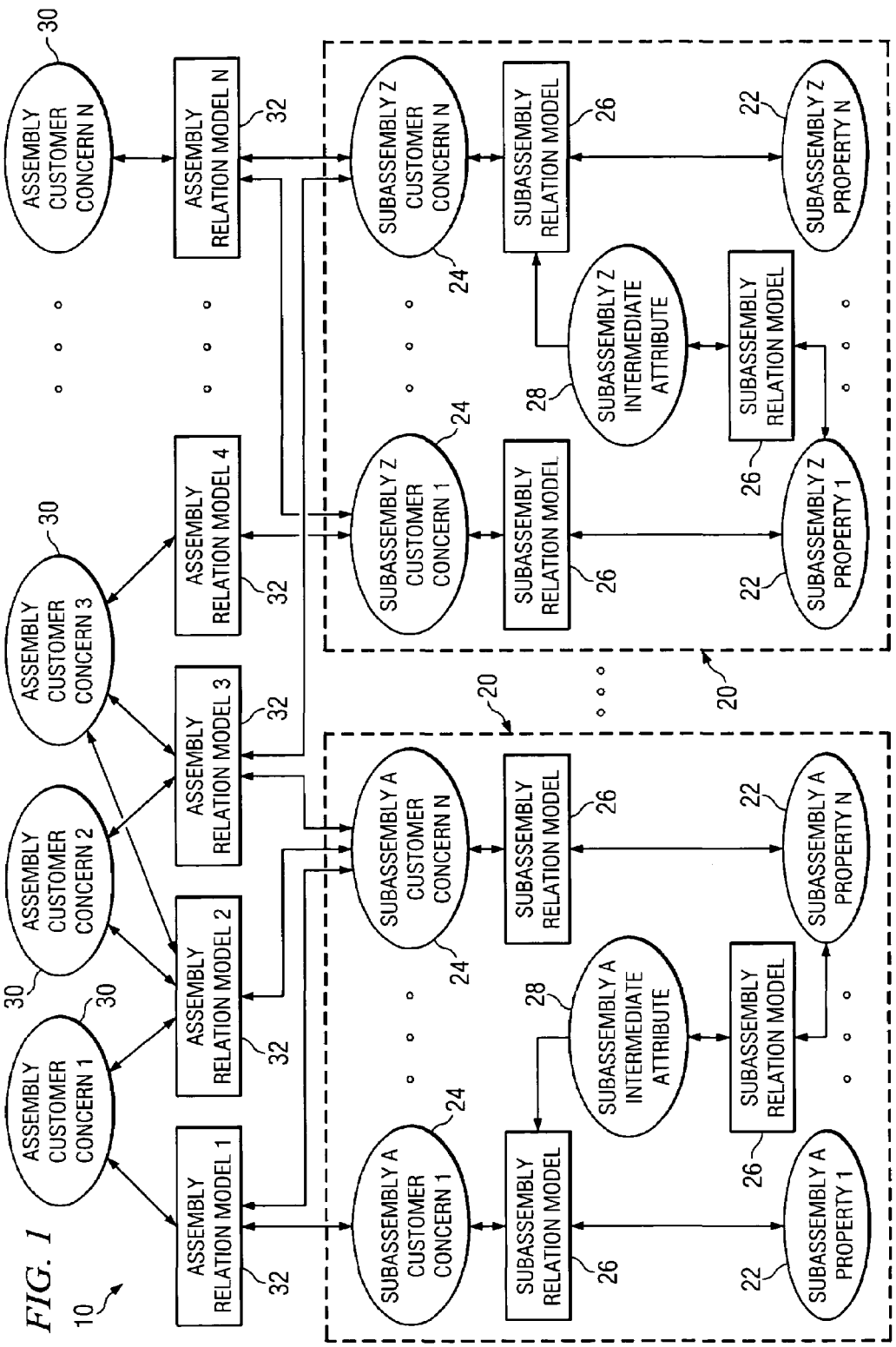
FIG. 1 illustrates a generic product design structure represented in terms of mathematical relations between product attributes, in accordance with one embodiment of the present invention.

FIG. 1 illustrates a generic product design structure 10 represented in terms of mathematical relations between various product attributes, in accordance with one embodiment of the present invention. The product attributes include both the properties associated with the physical components that comprise the product ("physical properties") and the product characteristics (resulting from the selection of particular physical properties) with which a customer or other entity for which the product is being made is concerned ("customer concerns"). Particular examples of product physical properties and customer concerns are described below in conjunction with FIG. 2.

Structure 10 represents the design of a product ("assembly") that includes multiple subassemblies. Although not illustrated, each subassembly may also include any suitable number of sub-subassemblies, each sub-subassembly may be further decomposed into sub-sub-subassemblies, and so on.

In the illustrated example, each subassembly 20 includes a number of subassembly physical properties 22. Each property 22 may be mathematically related to one or more customer concerns 24 of the subassembly 20. In other words, the selection of a physical property 22 has an effect on one or more customer concerns 24 of the subassembly 20 that can be represented mathematically. Such mathematical representations between physical properties 22 and subassembly customer concerns 24 are contained in a number subassembly relation models 26. Each relation model 26 thus defines the relationship between one or more physical properties 22 and one or more subassembly customer concerns 24.

Furthermore, each subassembly 20 may include one or more intermediate attributes 28. A physical property 22 may be directly related to a subassembly customer concern 24 and/or it may be related to a subassembly customer concern 24 through one or more intermediate attributes 28. Therefore, particular relation models 26 may define the relationship between a physical property 22 and an intermediate attribute 28, and particular relation models 26 may define the relationship between an intermediate attribute 28 and a subassembly customer concern 24. Although FIG. 1, illustrates example relationships between a particular number of physical properties 22, intermediate attributes 28, and subassembly customer concerns 24, it should be understood that any suitable number of and any appropriate relationships between these components may be implemented.

Structure 10 also includes one or more assembly customer concerns 30. Each assembly customer concern is mathematically related to one or more subassembly customer concerns 24. Such mathematical representations between assembly customer concerns 30 and subassembly customer concerns 24 are contained in a number of assembly relation models 32. Each relation model 32 thus defines the relationship between one or more assembly customer concerns 30 and one or more subassembly customer concerns 24.

Using structure 10 or a similarly-defined product design structure, a product design engineer can focus on selecting physical properties to achieve particular assembly and subassembly customer concerns (again, which represent what the customer or user is concerned with when selecting a particular product). Furthermore, the design engineer can far more easily experiment at the assembly level, juggling different physical properties to find acceptable trade-offs. Many mathematical analyses can be performed to determine concrete information for the design engineer in identifying optimal physical property combinations. Finally, when a product is decomposed as in structure 10, it becomes much easier for engineers to record the knowledge that they learn during a project in a form that will be usable in conjunction with later projects.

In particular embodiments, a product design structure, such as structure 10, and its various components may be stored as software in a computer-readable medium accessible by one or more computers. This software and the associated computers used to execute and store the software form a product design system. Engineers or other individuals associated with the design of the product with which the structure is associated may access the components of the structure using the system so that the engineers may view and modify information relating to the attributes (customer concerns, properties, intermediate attributes) and/or relation models of the structure. For example, an engineer may construct a relation model associating a property with a customer concern. Each of these relation models. (including the target values, ranges and profit models described below that are associated with the relation models) are mathematical relations of one or more dimensions. To specify mathematical relations, the design engineer may input mathematical formulae or may provide a set of values from which a formula can be derived via numerous different and well-known techniques (such as interpolation, linear regression, etc.). In particular embodiments, the mathematical relations may be specified imprecisely, reflecting only the general shape of the relation (e.g., increasing linearly), but not the precise numeric values. Such imprecise specifications allow engineers to express learned "rules of thumb" or other rough relationships and have the system able to perform rough-cut analyses and propagations to provide a level of insight to the engineers prior to the testing, experimentation, or analyses needed to specify the relations more precisely.

After entering a relation model, particular parameters associated with a property or other attribute with which the relation model is associated can then be selected and the effect on the customer concern or other attribute can be displayed. Further, certain embodiments may enable sophisticated search tools that allow an engineer to express desired values for attributes (whether customer concerns, physical properties, or intermediate attributes), and find any relations (through time) that support those values. For example, the system may search through all relation models and identify the relation models that match user-specified criteria based on the nature of the mathematical relationship and/or the nature of the values being related by the mathematical relationship.

Any suitable user interfaces may be used to enable the engineer to enter and view information in the manner described above.

Figure 2:
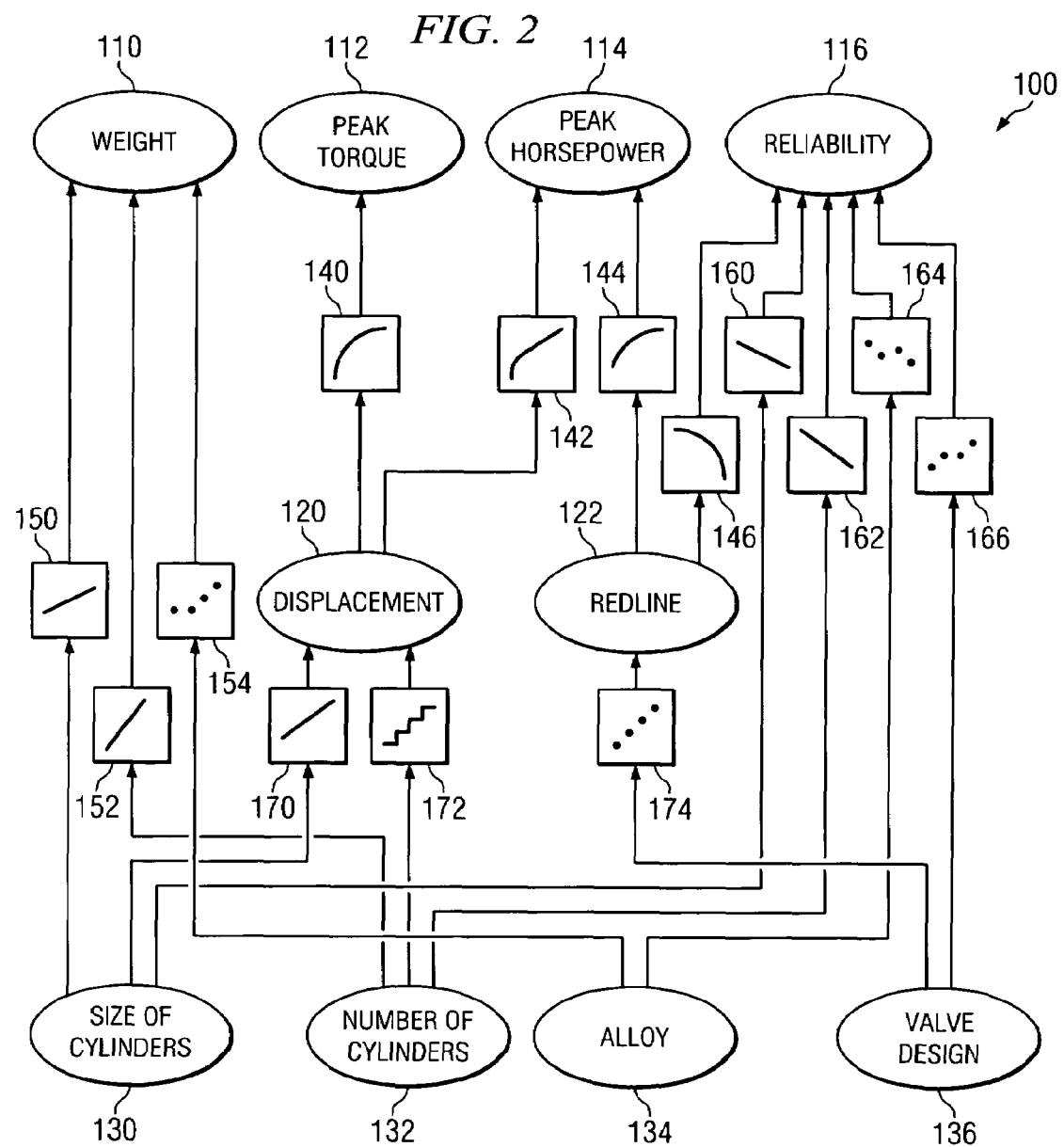
FIG. 2 illustrates an example subassembly design structure, in accordance with one embodiment of the present invention.

FIG. 2 illustrates an example engine subassembly design structure 100 for an automobile product design. For example, engine subassembly design structure 100 may be one example of a subassembly 20 of structure 10. It should be noted that structure 100 is greatly simplified compared to an actual such structure for an engine design, but serves as an example of the operation of an embodiment of the invention.

In FIG. 2, the customer or user concerns are represented by the following subassembly attributes (the generic term "attribute" will often be used to refer to any one of a customer concern, property, or intermediate attribute, for ease of reference): a weight attribute 110, a peak torque attribute 112, a peak horsepower attribute 114, and a reliability attribute 116. Each of those customer concerns is mathematically related to engine physical properties and/or intermediate attributes through relation models. Although particular types of relation models are illustrated (for example, continuous linear, stepped linear, exponential, etc.), any suitable technique of mathematically representing the relationship between attributes may be used.

In the example structure 100, weight attribute 110 is mathematically related to the cylinder size property 130, to the cylinder number property 132, and to the selected alloy property 134. The mathematical relation between the cylinder size property 130 and the weight attribute 110 is represented by relation model 150, which records knowledge of how much weight tends to increase with the size of cylinders. Similarly, relation model 152 records knowledge of how much weight tends to increase with the number of cylinders, and relation model 154 records knowledge of how much weight tends to vary with the type of alloy from which the engine is constructed.

The peak torque attribute 112 is related via relation model 140 to a displacement attribute 120. Relation model 140 records the knowledge of how torque tends to increase as displacement is increased. Displacement is an intermediate attribute, which assumes that it is not of immediate concern to customers, but is part of the relationship between one or more customer concerns (in this case, subassembly customer concerns) and one or more physical properties. In the illustrated example, displacement attribute 120 is related via relation model 170 to cylinder size property 130 and is related via relation model 172 to cylinder number property 132. To give examples of the various types of relation models, both relation models 170 and 172 are direct linear functions, although relation model 170 is continuous (one can choose any size of cylinder) whereas relation model 172 is discrete (one can only choose whole numbers of cylinders).

The peak horsepower attribute 114 is related via relation model 142 to displacement attribute 120 and is related via relation 144 to a redline attribute 122 (both of which are intermediate attributes). In this example, both relation models are increasing functions (as either attribute is increased, peak horsepower is increased). In turn, the redline attribute 122 is related via relation model 174 to the valve property 136. Finally, the reliability attribute 116 is related via relation models 160, 162, 164, and 166 to each of properties 130, 132, 134, and 136, respectively.

As described above with reference to structure 10, subassembly design structure 100 may be used (along with an assembly design structure in which structure 100 is included) to allow a design engineer to select physical properties associated with the subassembly design to achieve particular assembly and subassembly customer concerns. Although a solid model typically used to design an engine contains vast amounts of data on the engine (including all the information to compute all the attributes of the engine), a design engineer cannot identify the key design decisions to make when designing the engine or the key knowledge that feeds the design decisions. On the other hand, structure 100 can be used to identify these decisions and the associated knowledge.

Figure 3:
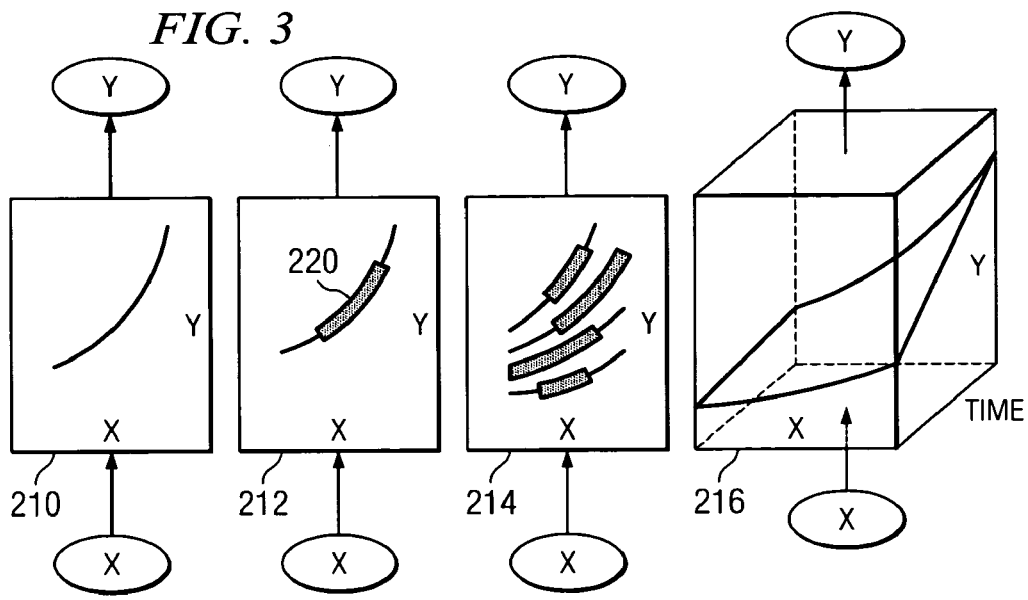
FIG. 3 illustrates example mathematical relationships between product attributes incorporating confidence levels and variations of relationships over time, in accordance with one embodiment of the present invention.

FIG. 3 illustrates example mathematical relationships between a customer concern "Y" and an example product physical property "X" incorporating confidence levels and variations of relationships over time (although "X" and "Y" may be any related product attributes, not necessarily customer concerns or physical properties). Relation model 210 depicts a relationship between customer concern Y and product physical property X that is generally increasing (as the controlling property X is increased, the controlled customer concern Y is increased). The relationship stored in relation model 210 (and other relation models) typically comes from a test (either a physical experiment to determine the values, or a simulation to achieve the same). However, some tests may be more precise than other tests. Furthermore, some tests may only test a specific range of values. Therefore, it may be desirable to record the confidence level associated with each portion of a relation model. The use of such confidence levels allows all knowledge regarding the relationship between property X and customer concern Y to be recorded (shaky knowledge need not be thrown out to avoid contaminating the solid knowledge), but the effect of such knowledge when designing a product may differ based on the confidence in the information.

Relation model 212 depicts the relationship between property X and customer concern Y as included in model 210, but with the addition of a confidence band 220 indicating values having a high confidence level. For example, the lower range of the curve under band 220 may have been tested under less than ideal circumstance, the middle range included in band 220 may have been thoroughly tested, and the upper range of the curve above band 220 may have been projected from the other values and not tested at all.

It should be understood that a design based upon a set of knowledge is only as good as that knowledge. Thus, it may often be important to be able to represent the degree of validity of each knowledge element, so that the product engineers will know if a design is based on shaky knowledge. Beyond that, for any design, product engineers will want to analyze where more testing needs to be done in order to elevate the confidence level, and thus the validity of the design.

Furthermore, tests may be run over time on larger ranges of values or in different circumstances, resulting in a series of relations over time. In addition, as technology changes, the relationship curves may move. Therefore, a product design system may need to include a series of relationships on a single chart to allow engineers to gain an understanding of change over time, as depicted in relation model 214 (and such relations may also include confidence levels, as depicted). For example, computer hardware engineers have gained a solid understanding of how quickly memory densities and processor speeds tend to advance each year. Based on that knowledge, they will make design decisions for longer lead-time products. To make the change over time more apparent to the user, a three-dimensional representation, such as in relation model 216, may be most useful in certain cases.

A new relationship may obsolete all earlier versions, leaving the most recent as the values to be used in the current design and leaving the series of changed relationships to be used as an indicator of future change. Alternatively, an average of all the relationships in the series may be used. A product design system incorporating the product design structure may support different "time models" for how to interpret a series of relationships that have changed over time.

Figure 4:
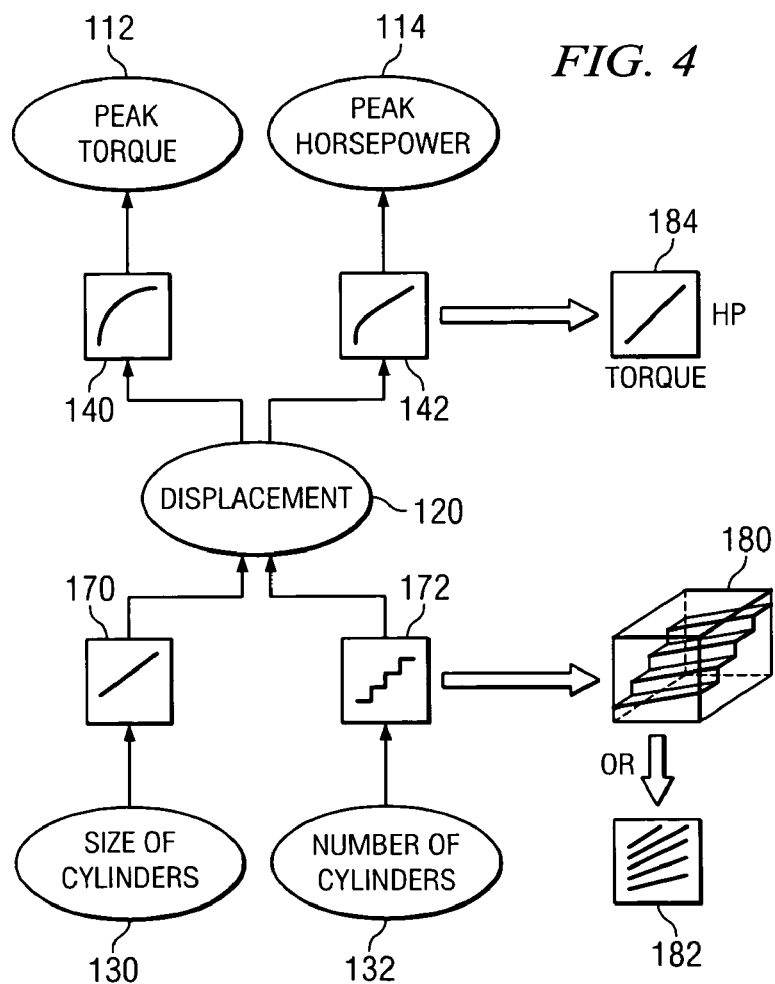
FIG. 4 illustrates example interactions of mathematical relations between product attributes, in accordance with one embodiment of the present invention.

FIG. 4 illustrates example interactions of mathematical relations between customer concerns and product physical properties of structure 100. In particular, FIG. 4 focuses on the relationship models 140, 142, 170, and 172 of FIG. 2 linking the peak torque attribute 112 and the peak horsepower attribute 114 of structure 100 with the cylinder size property 130 and the cylinder number property 132 of that structure (through displacement attribute 120).

To better determine the effects of cylinder size and cylinder number on displacement (and thus on peak torque and peak horsepower), particular embodiments support the combination of multiple relation models into a "multi-relation" model showing the relationship between multiple properties and a customer concern, multiple customer concerns and a property, multiple properties and multiple customer concerns, or other relationships between any other suitable combination of product attributes. For example, multi-relation model 180 depicts the combination of relations 170 and 172 into one three-dimensional relation model that allows the design engineer to far more easily visualize all of the options that are available when selecting the size and number of cylinders in order to control the displacement. Alternatively, a multi-line two-dimensional relation model 182 could also be used rather than or in addition to three-dimensional relation model 180.

As another example, multi-relation model 184 depicts the combination of relation models 140 and 142. Relation model 184 is a "co-relation" model since it shows the relation of two customer concerns. Model 184 shows how peak horsepower is related to peak torque with varying displacement (but assuming redline, which also is related to peak horsepower in structure 100, remains constant). Such a co-relation may help a design engineer more quickly understand a trade-off between two customer concerns and may enable the engineer to select particular product properties based simply on customers' relative desires for the two customer concerns that are co-related.

The opposite computation is also possible. Testing or analysis may be performed to determine the effects of two properties on a customer concern, directly constructing a three-dimensional relation such as depicted in relation 180. An engineer may then want to look at the individual relations between just one or the other of the properties on the customer concern. Either of the two-dimensional relations 170 or 172 can be displayed, computed from the relation 180.

In some cases, relationships may be dependent upon other relationships. For example, consider relations 152 and 154 of structure 100 in FIG. 2. It may be that the density of an alloy choice may have an obvious near-linear effect on weight and that the number of cylinders may have an obvious near-linear effect on weight, but that the combined effect of the two relationships may be more complicated. For example, certain alloys, due to strength issues or expansion issues, require thicker cylinder walls than other alloys. Thus, the alloy choice dictates not only a density, but also a cylinder wall thickness change. Thus, the effect of alloy choice on weight depicted in relation model 154 may not be directly related to alloy density, but rather may be taking multiple issues into account. In that case, engineers may have tested or computed the effect of number of cylinders on weight separately for each alloy. In that case, combining relation models 152 and 154 into a multi-relation model would result in the display of a relationship that is essentially sorting out the data of relation model 152 corresponding to each different alloy in relation model 154. The depiction of relation model 152 itself would involve averaging the different alloy-specific curves to come up with the generalized effect of the number of cylinders on weight. Relation model 152 would thus be considered to be dependent upon relation model 154.

Figure 5:
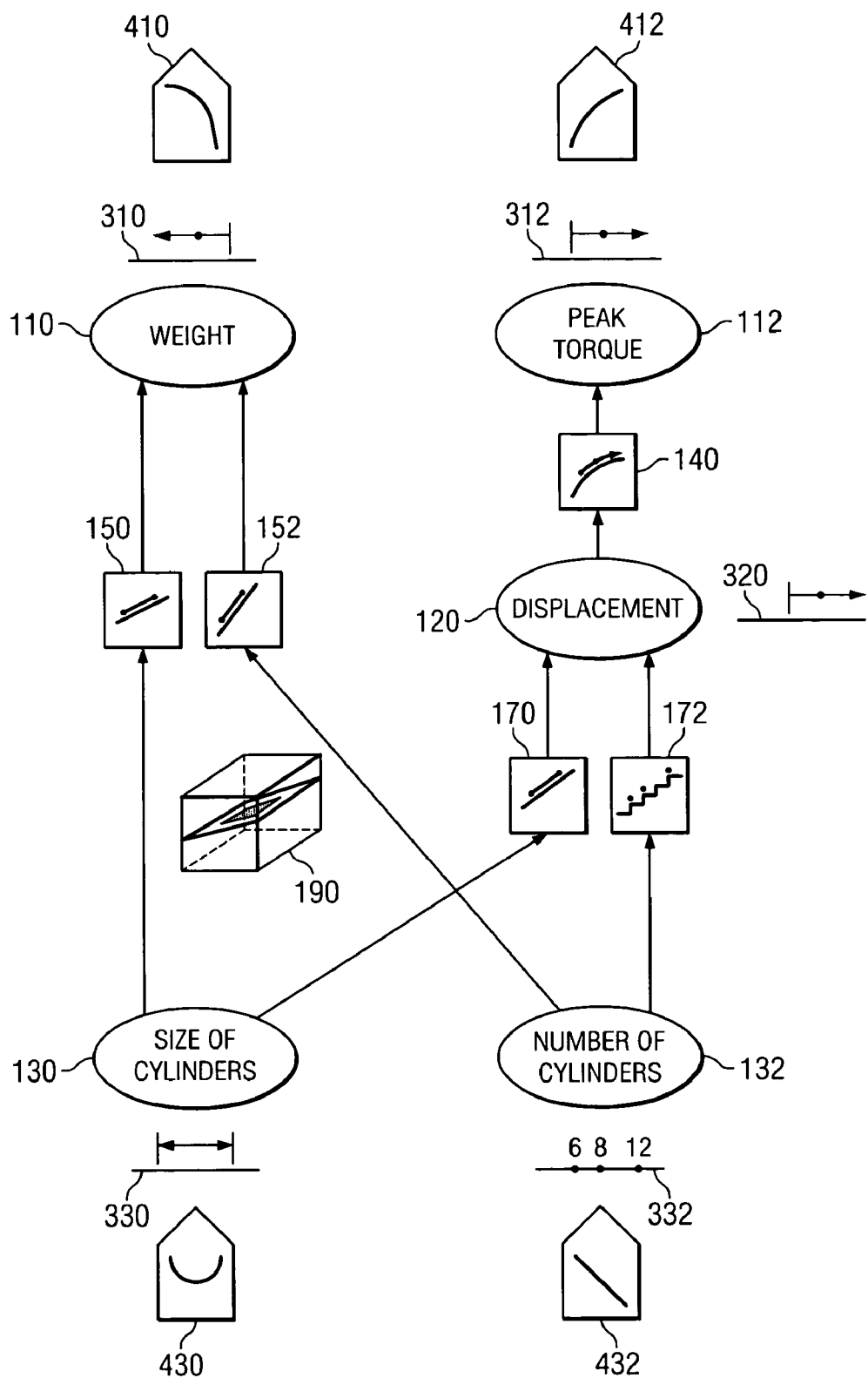
FIG. 5 illustrates targets, allowed ranges, and profit models associated with the mathematical relations between product attributes, in accordance with one embodiment of the present invention.

FIG. 5 illustrates the use of targets, allowed ranges, and profit models associated with the mathematical relations between particular attributes, such as between customer concerns and physical properties. Specifically, FIG. 5 focuses as an example on the relationships affecting the weight attribute 110 and the peak torque attribute 112 of structure 100 of FIG. 2. For a particular product being designed, the product engineers may have certain targets for the product's customer concerns that are defined by competitors' products, by their product marketing organization, or by customer requests. Furthermore, in addition to a target value for a customer concern, there may be a minimum and/or maximum acceptable value or a range of acceptable values for that customer concern.

For example, a range 310 for weight attribute 110 indicates that the weight must be below a certain maximum weight and also identifies a target value for the weight (indicated by a "dot") that is below the maximum weight. Similarly, a range 312 for peak torque attribute 112 indicates that peak torque must be at or above a certain minimum level, and that the target is somewhat higher than that minimum acceptable peak torque. An allowed range may also have both minimum and maximum values. For example, range 330 associated with cylinder size attribute 130 indicates that the size of the cylinders cannot be below a specified minimum size or above a specified maximum size. A range may alternatively include particular discrete values (instead of a range of values) that are acceptable. For example, range 332 associated with cylinder number attribute 132 indicates that the number of cylinders needs to be either six, eight, or twelve (for example, to fit competitive norms, to fit standard tooling, or to satisfy other design criteria). Furthermore, one of these values may also be a target value.

Given one or more ranges and/or target values for one or more attributes (such as customer concerns), a product design system implementing the product design structure can map these targets and allowed ranges to the relation models associated with these customer concerns and can then map these values to other attributes, such as intermediate attributes. For example, a minimum and a target displacement can be computed for displacement attribute 120 that corresponds to the minimum and target values for the peak torque attribute 112 using relation model 140. In turn, the target and allowed range for displacement attribute 120 allows a corresponding target and allowed range for properties 130 and 132 to be computed using relation models 170 and 172, respectively. Such a computed target and allowed range for each property 130 and 132 would be gated by the allowed ranges for properties 130 and 132.

Note, however, that properties 130 and 132 can also have an allowed range and target computed via relation models 150 and 152, respectively, from the independent target and allowed range defined for weight attribute 110. A product design system can combine the allowed range and target for property 130 derived from attribute 110 with the allowed range and target for property 130 derived from attribute 112. The ranges may be combined mathematically as an intersection of the two ranges (the values allowed by both). The targets may be combined in various ways, at the design engineer's discretion. For example, an average or median value may be used or an "optimization" value may be computed by examining the rate of change of weight and of torque such that the ratio of torque over weight is maximized within the allowed ranges.

In this way, as design goals are defined or as design decisions are made, the allowed ranges and the targets can be propagated throughout the product design structure. This will allow conflicts or other problems created by a certain product property selection to be detected immediately. For example, if an allowed weight range is chosen and an allowed peak torque range is chosen that cannot both be satisfied given the existing knowledge, that conflict can be immediately detected. This allows engineers to go to work on that specific issue, perhaps looking at new alloys or other technologies to generate new knowledge of one of the relations that would in fact permit the desired weight range and the desired peak torque to be achieved by one engine.

In addition, a product design structure may be able to show the targets and ranges not only for the individual relation models, but also for combined relation models (multi-relations). For example, multi-relation model 190, which is a three-dimensional relation model identifying the relationship between weight and both cylinder size and cylinder number, identifies the allowed ranges in each dimension. Such visibility allows a design engineer to much more quickly understand the breadth of his design options (or his lack of options, as the case may be).

As previously noted, in many cases the design engineer will be faced with situations where considering all allowed ranges, the targets for two customer concerns will both be achievable independently, but not necessarily together. For example, increasing peak torque will tend to increase weight, while reducing weight will tend to reduce peak torque. Thus, to select the "best" value for each, the engineer must make a trade-off. The product design system may support a simple approach such as "splitting the difference" or finding the median value between the two targets. The system may also support a more advanced approach in which the system would define a combined target. For instance, in the example above, the trade-off could be made by telling the system to maximize the ratio of peak torque divided by weight. Extending this concept to larger collections of product attributes and relation models, the system will also allow an engineer to enter in complex mathematical formulae defined in terms of those attributes such that a single number indicating "goodness" can be computed. The system would then find the optimal value for all the attributes such that goodness is maximized.

However, as the number of related attributes gets large, custom crafting such optimization criteria can become quite difficult and tedious and error-prone for the design engineer. To simplify the process, the product design system and product design structure may include "profit models." The term "profit model" is derived from the notion that, in the end, the business and the design engineers are trying to develop a product that will be most profitable. Thus, if you can define the profitability impact of reducing weight and the profitability impact of increasing peak torque, then the system can, rather than maximizing peak torque divided by weight, instead maximize overall profitability impact.

A profitability impact may be represented as a mathematical weighting and thus it could be used to represent any "preference" criteria—it need not represent actual business profitability. Furthermore, the cost of various properties can be represented with the same profitability model. For example, the added cost of including twelve cylinders rather than eight cylinders can be factored into the decision on whether to increase the number of cylinders or increase the cylinder size in order to achieve the desired displacement.

Referring again to FIG. 5, profit models are associated with each subassembly customer concern and with each physical property. For example, profit models 410 and 412 correspond to attributes 110 and 112, respectively. The example profit model 410 indicates that profitability increases as weight decreases, but that the increases in profitability taper off fairly significantly with decreasing weight. Similarly, profit model 412 shows that profitability increases as peak torque increases, tapering off, but maintaining continued effect. Thus, using the profit models, the system can compute optimal values that are comparable to values obtained by analyzing a ratio of factors (for example, maximizing the ratio of peak torque divided by weight), but with the added richness of recognizing that excessive reductions in weight will not be as valuable as excessive increases in peak torque.

Furthermore, profit model 432 identifies the near-linear cost increases (profit decreases) of adding cylinders (property 132). Profit model 430 identifies that the costs associated with cylinder sizing (property 130) increase as the size gets excessively small or large. In fact, the costs get prohibitively high quickly. Thus, with such profit model, there is less need to define the allowed range for attribute 130, since the profit model would highly discourage selecting values out of that range anyway.

Figure 6:
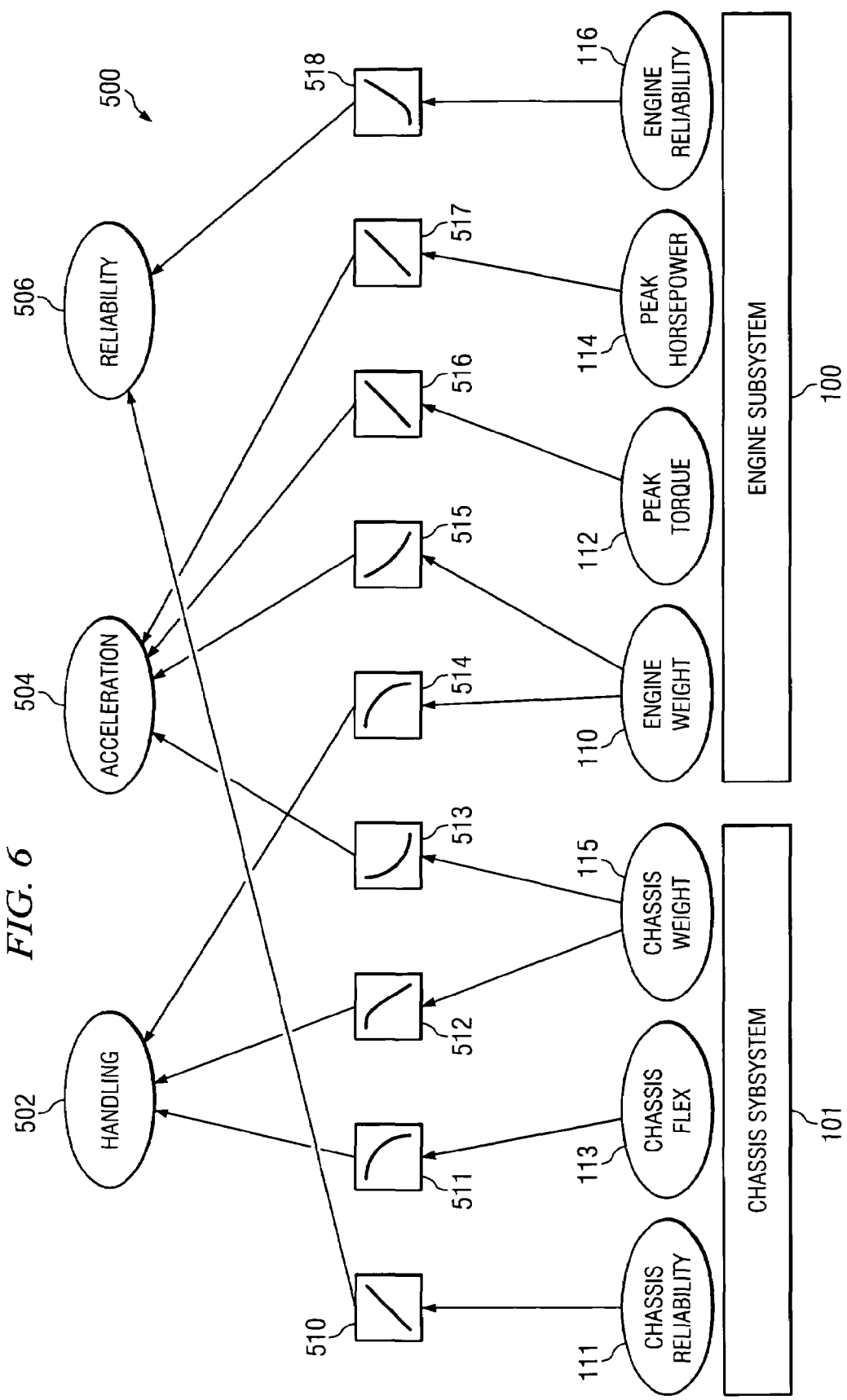
FIG. 6 illustrates an example overall product design structure that includes the example subassembly design structure of FIG. 2, in accordance with one embodiment of the present invention.

FIG. 6 illustrates an example overall product design structure 500 that includes the example subassembly design structure 100 of FIG. 2, in accordance with one embodiment of the present invention. As described above in association with structure 10 of FIG. 1, large assemblies are typically broken down into subassemblies such that different design engineers can focus on smaller portions of the whole. Representing product designs as mathematical relations between the various product attributes typically provides exceptional value to the development process with such large assemblies.

Using structure 500 or other product design structures, mathematical relations, ranges, targets, and profit models are passed from the assembly design engineers to the design engineers associated with each subassembly rather than passing down specifications. In addition, rather than partially designing each subassembly before the subassembly engineers have had any input, an assembly engineer may simply transfer knowledge and desired attributes to the subassembly engineers. Furthermore, the subassembly design engineers need not respond with a fully-drafted design model, but rather with knowledge expressed in terms of mathematical relations and possible ranges. In this way, the assembly design engineer can continue to evaluate possibilities permitted by each subassembly, and can continue to pass down targets and allowed ranges to the subassembly designers based on the expanding knowledge being provided by the other subassembly design engineers. Therefore, instead of giving a specification to a subassembly engineering group and hoping that the group will develop a subassembly design that will meet the specification (and often getting late notice that it cannot be done), product design systems of embodiments of the present invention enable assembly designers and subassembly designers to continue to design collaboratively, working as a distributed team towards accomplishing all the targets within the allowed ranges and maximizing profitability as defined by the profit models.

Referring now to FIG. 6, product design structure 500 represents a simplified design structure for an automobile that includes engine subassembly design structure 100 (described above with reference to FIG. 2). Most of engine subassembly 100 is simply represented by a block, although engine subassembly customer concerns 110, 112, 114, and 116 are specifically illustrated. Furthermore, as an example, structure 500 also includes a chassis subassembly 101 that includes the following customer concerns: a chassis reliability attribute 111, a chassis flex attribute 113, and a chassis weight attribute 115. As with subassembly 100, the various physical properties, intermediate attributes, and relation models of subassembly 101 are not illustrated for simplicity. In addition to subassemblies 100 and 101 being simplified for purposes of illustration, it should also be understood that an actual automobile or other complex product structure would typically have numerous other subassemblies (and possible numerous sub-subassemblies, etc.) although only two subassemblies are illustrated.

Structure 500 includes three assembly customer concerns: a handling attribute 502, an acceleration attribute 504, and a reliability attribute 506. Again, although only three assembly customer concerns are shown, an actual complex product design structure would typically have many more assembly customer concerns. Structure 500 includes numerous mathematical relations that associate these assembly customer concerns with the various subassembly customer concerns of subassemblies 100 and 101.

For example, product design structure 500 indicates that the chassis subassembly 101 is associated with the assembly customer concerns via a number of relation models. For instance, handling attribute 502 is related to chassis flex attribute 113 via a relation model 511 and is related to chassis weight attribute 115 via a relation model 512. Similarly, acceleration attribute 504 is related to chassis weight attribute 115 via a relation model 513, and reliability attribute 506 is related to chassis reliability attribute 111 via relation model 510. In that way, the targets and allowed ranges and any profit models for the vehicle customer concerns can be passed down mathematically to the chassis subassembly designers.

Similarly, product design structure 500 indicates that the engine subassembly 100 is associated with the assembly customer concerns via a number of relation models. For example, handling attribute 502 is related to engine weight attribute 110 via relation model 514. Furthermore, acceleration attribute 504 is related to engine weight attribute 110, peak torque attribute 112, and peak horsepower attribute 114 via relation models 515, 516, and 517, respectively. In addition, reliability attribute 506 is related to engine reliability attribute 116 via relation model 518.

In this way, all of the assembly customer concerns are mathematically related to all of the subassembly customer concerns and other attributes. The knowledge captured, the options available, and the targets sought can all be analyzed by the system and displayed to the design engineers at all levels, as desired. At the same time, the product design system can allow an assembly designer to work on assembly issues while ignoring the details of the subassemblies, only focusing on the collective knowledge that has been collected by the system in the terms of the attributes that the assembly designer defined as "care-abouts" on that subassembly.

Therefore, embodiments of the present invention thus enable a much richer collaboration between the design engineers, in terms of knowledge of what is possible, knowledge of what is targeted, and knowledge of what is allowed. That visibility enables further innovation. As one engineer finds himself restricted, he can easily dig into the supporting knowledge and make suggestions to the other engineers on how those restrictions might be avoided. Opportunities for further gains are visible to the subassembly engineers, such that they can put effort in the right areas to best achieve the larger objectives. All of this is in stark contrast to the traditional methods of communicating design specifications down to the subassembly engineers and finished designs up to the assembly engineers. The opportunity for communicating deep knowledge, learning, and innovation using these traditional methods are severely limited.

It should be noted that the assembly and subassembly engineers need not agree on attribute definitions. In particular, the subassembly engineer may be designing the same engine to satisfy multiple different assembly designs. Thus, the product design system must allow mathematical relations to be specified between the subassembly attributes of each different assembly and the attributes of their own design work. In many cases, such as this one, the attributes will match up. However, in this way, an engine subassembly designer can optimize the combined profit models across numerous assemblies that all include the same engine subassembly, though perhaps each specifying different targets, allowed ranges, and profit models.

Further, note that a subassembly may be designed by engineers in a separate company than the assembly engineers. For instance, the automotive company designing the automobile, in the above example, may be working with one supplier (separate company) that supplies the engine and another supplier that supplies the chassis. The richer form of collaboration provided by this system need not be limited in any way by such company boundaries; but, the ability to setup intermediate relations still allows the companies to make independent decisions and to setup product design structures to satisfy their own needs.

As described above, traditional product development is based upon specifications and drawings or models of the product being designed. With a relation-based product development capability as described herein, much design work can be performed prior to the first drawing or model being built. However, it should not be forgotten that those relations represent knowledge learned about a real entity for which there is an associated model, drawing or prototype. This is important to understand because a design violating the assumptions that knowledge was based upon, invalidates the knowledge itself (or at least compromises it tremendously). Thus, associated with a set of relations may be a drawing or model that represents not a single design, but rather a range of designs or a family of designs for which that knowledge is valid.

This becomes particularly important when designing complex assemblies. When attributes and targets are set for each subassembly, a drawing, model or specification of physical dimensions will typically need to be set as well. For example, when passing down attributes down for the chassis and engine of a vehicle, certain assumptions have been made. At the very least, the engine must fit inside the space left for it in the chassis. But beyond that, engine mount points must be agreed to.

Traditionally, the assembly designer would specify the basics of all subassemblies, dictating interfaces and mounting points. With the relation-based development capability, those decisions will typically be left until later, and may not even be dictated by the assembly engineer. For example, the assembly may specify a volume of space that each subassembly must be contained within, and which subassemblies will be adjacent, but not specify the precise interconnections. Then, based upon the targets for the attributes, the subassembly engineers may work together to connect the subassemblies, each based upon the knowledge visible in their respective subassembly relations.

Thus, solid modeling and drafting systems can better work with a relation-based development system by embracing the notions of boundaries and ranges, and allowing them to be associated with a set of knowledge relations, attributes, and targets. Further, solid modeling and drafting systems can allow the engineers to leverage the knowledge available in the various relations to accelerate and improve decision-making regarding the decisions that are naturally made and recorded in that solid modeling or drafting system. In addition, the above discussion is not limited to solid modeling and drafting systems, but extends naturally to other design systems. For example, in the case of a design system used to help compute a proper mixture of metals for an alloy for a certain application, the system can both feed and utilize relations regarding the tested effects of alloy mixture on the product using that mixture. Any other suitable design system may also be incorporated into particular embodiments.

Although the present invention has been described with several embodiments, a plethora of changes, substitutions, variations, alterations, and modifications may be suggested to one skilled in the art, and it is intended that the invention encompass all such changes, substitutions, variations, alterations, and modifications as fall within the spirit and scope of the appended claims.

What is claimed is:

1. Product design software embodied in a computer-readable medium and, when executed using a computer system, operable to: enable a user to define a product design structure, the product design structure comprising a plurality of customer concerns, a plurality of physical properties associated with components of the product, and a plurality of relation models, each customer concern being associated with at least one physical property via at least one mathematical relationship defined in at least one of the relation models; enable the user to input a value associated with one or more of the physical properties; calculate, using one or more of the relation models, the effect of the inputted value associated with the one or more physical properties on one or more of the customer concerns; display the calculated effect on the one or more customer concerns to the user; and enable the user to adjust the value associated with one or more of the physical properties to create a desired effect on one or more of the customer concerns, and wherein the product design structure further comprises a target value and an allowed range of values associated with one or more of the customer concerns and/or one or more of the physical properties, and wherein the product design software is further operable to generate a target value and an allowed range of values for a customer concern and/or a physical property based on the target value and the allowed range of values associated with another customer concern and/or another physical property via one or more of the relation models.

2. The product design software of claim 1, further operable to mathematically propagate the target value and the allowed range of values associated with a customer concern and/or a physical property to one or more related customer concerns and/or physical properties via one or more of the relation models.

3. The product design software of claim 1, further operable to combine two or more of the relation models to create a multi-relation model defining the relationship between multiple customer concerns and/or multiple physical properties.

4. The product design software of claim 1, wherein the product design structure that may be defined by the user further comprises one or more profit models associated with one or more of the customer concerns and/or one or more of the physical properties.

5. The product design software of claim 4, further operable to perform a mathematical optimization using the profit models to identify particular combinations of physical properties that are the most profitable.

6. The product design software of claim 1, wherein the product design structure that may be defined by the user further comprises a confidence level associated with the mathematical relationship defined in at least one of the relation models.

7. The product design software of claim 6, further operable to mathematically propagate a confidence level associated with a relation model to one or more associated relation models, customer concerns, and/or physical properties.

8. The product design software of claim 1, wherein:
the product design structure that may be defined by the user further comprises a plurality of customer concerns associated with an overall product assembly and a plurality of customer concerns associated with one or more subassemblies of the product;
one or more of the customer concerns associated with the overall product assembly are associated with one or more of the customer concerns associated with a subassembly of the product via one or more of the relation models; and
one or more of the customer concerns associated with a subassembly of the product are associated with one or more of the physical properties via one or more of the relation models.

9. The product design software of claim 8, wherein one or more of the customer concerns associated with a subassembly of the product are associated with one or more of the physical properties via one or more intermediate product attributes and associated relation models.

10. The product design software of claim 1, wherein the mathematical relationship associated with one or more of the relation models is specified imprecisely so as to reflect only the general shape of the relationship and not precise numeric values associated with the relationship.

11. The product design software of claim 1, further operable to search through all relation models and identify the relation models that match user-specified criteria based on the nature of the mathematical relationship and/or the nature of the values being related by the mathematical relationship.

12. A product design method, comprising: accessing a defined a product design structure, the product design structure comprising a plurality of customer concerns, a plurality of physical properties associated with components of the product, and a plurality of relation models, each customer concern being associated with at least one physical property via at least one mathematical relationship defined in at least one of the relation models; receiving a value associated with one or more of the physical properties; calculating, using one or more of the relation models, the effect of the received value associated with the one or more physical properties on one or more of the customer concerns; displaying the calculated effect on the one or more customer concerns; and receiving one or more adjustments of the value associated with one or more of the physical properties to create a desired effect on one or more of the customer concerns, and wherein the product design structure further comprises a target value and an allowed range of values associated with one or more of the customer concerns and/or one or more of the physical properties, and generating a target value and an allowed range of values for a customer concern and/or a physical property based on the target value and the allowed range of values associated with another customer concern and/or another physical property via one or more of the relation models.

13. The method of claim 12, further comprising mathematically propagating the target value and the allowed range of values associated with a customer concern and/or a physical property to one or more related customer concerns and/or physical properties via one or more of the relation models.

14. The method of claim 12, further comprising combining two or more of the relation models to create a multi-relation model defining the relationship between multiple customer concerns and/or multiple physical properties.

15. The method of claim 12, wherein the product design structure further comprises one or more profit models associated with one or more of the customer concerns and/or one or more of the physical properties.

16. The method of claim 15, further comprising performing a mathematical optimization using the profit models to identify particular combinations of physical properties that are the most profitable.

17. The method of claim 12, wherein the product design structure further comprises a confidence level associated with the mathematical relationship defined in at least one of the relation models.

18. The method of claim 17, further comprising mathematically propagating a confidence level associated with a relation model to one or more associated relation models, customer concerns, and/or physical properties.

19. The method of claim 12, wherein:
the product design structure further comprises a plurality of customer concerns associated with an overall product assembly and a plurality of customer concerns associated with one or more subassemblies of the product;
one or more of the customer concerns associated with the overall product assembly are associated with one or more of the customer concerns associated with a subassembly of the product via one or more of the relation models; and
one or more of the customer concerns associated with a subassembly of the product are associated with one or more of the physical properties via one or more of the relation models.

20. The method of claim 19, wherein one or more of the customer concerns associated with a subassembly of the product are associated with one or more of the physical properties via one or more intermediate product attributes and associated relation models.

21. The method of claim 12, wherein the mathematical relationship associated with one or more of the relation models is specified imprecisely so as to reflect only the general shape of the relationship and not precise numeric values associated with the relationship.

22. The method of claim 12, further comprising searching through all relation models and identifying the relation models that match user-specified criteria based on the nature of the mathematical relationship and/or the nature of the values being related by the mathematical relationship.

23. A system for product development, comprising a computer system operable to:
enable a user to define a product design structure, the product design structure comprising a plurality of customer concerns, a plurality of physical properties associated with components of the product, and a plurality of relation models, each customer concern being associated with at least one physical property via at least one mathematical relationship defined in at least one of the relation models; enable the user to input a value associated with one or more of the physical properties; calculate, using one or more of the relation models, the effect of the inputted value associated with the one or more physical properties on one or more of the customer concerns; display the calculated effect on the one or more customer concerns to the user; and enable the user to adjust the value associated with one or more of the physical properties to create a desired effect on one or more of the customer concerns, and wherein the product design structure further comprises a target value and an allowed range of values associated with one or more of the customer concerns and/or one or more of the physical properties, and wherein the computer system is further operable to generate a target value and an allowed range of values for a customer concern and/or a physical property based on the target value and the allowed range of values associated with another customer concern and/or another physical property via one or more of the relation models.

24. The system of claim 23, further operable to mathematically propagate the target value and the allowed range of values associated with a customer concern and/or a physical property to one or more related customer concerns and/or physical properties via one or more of the relation models.

25. The system of claim 23, further operable to combine two or more of the relation models to create a multi-relation model defining the relationship between multiple customer concerns and/or multiple physical properties.

26. The system of claim 23, wherein the product design structure that may be defined by the user further comprises one or more profit models associated with one or more of the customer concerns and/or one or more of the physical properties.

27. The system of claim 26, further operable to perform a mathematical optimization using the profit models to identify particular combinations of physical properties that are the most profitable.

28. The system of claim 23, wherein the product design structure that may be defined by the user further comprises a confidence level associated with the mathematical relationship defined in at least one of the relation models.

29. The system of claim 28, further operable to mathematically propagate a confidence level associated with a relation model to one or more associated relation models, customer concerns, and/or physical properties.

30. The system of claim 23, wherein:
the product design structure that may be defined by the user further comprises a plurality of customer concerns associated with an overall product assembly and a plurality of customer concerns associated with one or more subassemblies of the product;
one or more of the customer concerns associated with the overall product assembly are associated with one or more of the customer concerns associated with a subassembly of the product via one or more of the relation models; and
one or more of the customer concerns associated with a subassembly of the product are associated with one or more of the physical properties via one or more of the relation models.

31. The system of claim 30, wherein one or more of the customer concerns associated with a subassembly of the product are associated with one or more of the physical properties via one or more intermediate product attributes and associated relation models.

32. The system of claim 23, wherein the mathematical relationship associated with one or more of the relation models is specified imprecisely so as to reflect only the general shape of the relationship and not precise numeric values associated with the relationship.

33. The system of claim 23, further operable to search through all relation models and identify the relation models that match user-specified criteria based on the nature of the mathematical relationship and/or the nature of the values being related by the mathematical relationship.

34. Product design software embodied in a computer-readable medium and when executed operable to:
enable a user to define a product design structure, the product design structure comprising a plurality of customer concerns, a plurality of physical properties associated with components of the product, and a plurality of relation models, the plurality of customer concerns comprising a plurality of customer concerns associated with an overall product assembly and a plurality of customer concerns associated with one or more subassemblies of the product, wherein one or more of the customer concerns associated with the overall product assembly are associated with one or more of the customer concerns associated with a subassembly of the product via one or more of the relation models, wherein one or more of the customer concerns associated with a subassembly of the product are associated with one or more of the physical properties via one or more of the relation models, and wherein the product design structure further comprises a profit model, a target value and an allowed range of values associated with one or more of the customer concerns and/or one or more of the physical properties and comprises a confidence level associated with the mathematical relationship defined in at least one of the relation models;

enable the user to input a value associated with one or more of the physical properties; calculate, using one or more of the relation models, the effect of the inputted value associated with the one or more physical properties on one or more of the customer concerns;

display the calculated effect on the one or more customer concerns to the user; and enable the user to adjust the value associated with one or more of the physical properties to create a desired effect on one or more of the customer concerns.

\* \* \* \* \*

UNITED STATES PATENT AND TRADEMARK OFFICE
CERTIFICATE OF CORRECTION

PATENT NO. : 7,627,850 B2  Page 1 of 1
APPLICATION NO. : 10/970745
DATED : December 1, 2009
INVENTOR(S) : Kennedy et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1232 days.

Signed and Sealed this

Twenty-first Day of December, 2010

David J. Kappos
*Director of the United States Patent and Trademark Office*